US011476225B2

United States Patent
Takeda

(10) Patent No.: US 11,476,225 B2
(45) Date of Patent: Oct. 18, 2022

(54) RECESS PORTION IN THE SURFACE OF AN INTERCONNECTION LAYER MOUNTED TO A SEMICONDUCTOR DEVICE

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Shun Takeda, Yokohama Kanagawa (JP)

(73) Assignees: KABUSHIKI KAISHA TOSHIBA, Tokyo (JP); TOSHIBA ELECTRONIC DEVICES & STORAGE CORPORATION, Tokyo (JP)

( * ) Notice: Subject to any disclaimer, the term of this patent is extended or adjusted under 35 U.S.C. 154(b) by 44 days.

(21) Appl. No.: 17/191,272

(22) Filed: Mar. 3, 2021

(65) Prior Publication Data

US 2022/0093554 A1    Mar. 24, 2022

(30) Foreign Application Priority Data

Sep. 24, 2020 (JP) .............................. JP2020-160230

(51) Int. Cl.
*H01L 23/495* (2006.01)
*H01L 23/48* (2006.01)
(Continued)

(52) U.S. Cl.
CPC .............. *H01L 24/40* (2013.01); *H01L 23/40* (2013.01); *H01L 23/4334* (2013.01); *H01L 23/49811* (2013.01); *H01L 23/49838* (2013.01); *H01L 24/29* (2013.01); *H01L 24/32* (2013.01); *H01L 24/37* (2013.01); *H01L 24/41* (2013.01);
(Continued)

(58) Field of Classification Search
CPC ......... H01L 24/83; H01L 24/84; H01L 24/30; H01L 24/33; H01L 24/38; H01L 24/40; H01L 24/29; H01L 24/32; H01L 24/37; H01L 24/73; H01L 24/41; H01L 23/40;
(Continued)

(56) References Cited

U.S. PATENT DOCUMENTS 6,703,707 B1    3/2004  Mamitsu et al.
2005/0230820 A1*  10/2005  Licht .................... H01L 25/072
                                                          257/E23.104
(Continued)

FOREIGN PATENT DOCUMENTS

JP    H10-242331 A    9/1998
JP    2016-018866 A   2/2016

*Primary Examiner* — Alonzo Chambliss
(74) *Attorney, Agent, or Firm* — Foley & Lardner LLP

(57) ABSTRACT

A semiconductor module includes: a board; a semiconductor device disposed on the board, a first surface of the semiconductor device closer to the board being connected to the board; an interconnection layer to which a second surface of the semiconductor device opposite to the first surface is connected, and which has a recess portion on an opposite surface to a surface closer to the semiconductor device; a first metal film disposed in the recess portion of the interconnection layer via a bonding film, and that is electrically connected to the interconnection layer; an insulating layer disposed on the first metal film; and a heat transfer plate disposed on the insulating layer.

18 Claims, 3 Drawing Sheets

(51) Int. Cl.

| | |
|---|---|
| *H01L 23/34* | (2006.01) |
| *H01L 21/00* | (2006.01) |
| *H05K 7/18* | (2006.01) |
| *H05K 7/20* | (2006.01) |
| *H01L 23/00* | (2006.01) |
| *H01L 23/40* | (2006.01) |
| *H01L 23/433* | (2006.01) |
| *H01L 25/07* | (2006.01) |
| *H01L 25/065* | (2006.01) |
| *H01L 23/498* | (2006.01) |

(52) U.S. Cl.
CPC .......... *H01L 24/73* (2013.01); *H01L 25/0655* (2013.01); *H01L 25/072* (2013.01); *H01L 24/30* (2013.01); *H01L 24/38* (2013.01); *H01L 24/83* (2013.01); *H01L 2224/29299* (2013.01); *H01L 2224/40137* (2013.01); *H01L 2224/40225* (2013.01)

(58) Field of Classification Search
CPC ......... H01L 23/49811; H01L 23/49838; H01L 25/072; H01L 25/0655
See application file for complete search history.

(56) References Cited

U.S. PATENT DOCUMENTS

| | | | |
|---|---|---|---|
| 2010/0127383 A1* | 5/2010 | Oka | H01L 25/072 257/692 |
| 2011/0037166 A1* | 2/2011 | Ikeda | H01L 23/473 257/E23.101 |
| 2015/0340350 A1* | 11/2015 | Koga | H01L 24/33 257/713 |
| 2019/0279943 A1 | 9/2019 | Soda et al. | |

\* cited by examiner

US 11,476,225 B2

RECESS PORTION IN THE SURFACE OF AN INTERCONNECTION LAYER MOUNTED TO A SEMICONDUCTOR DEVICE

CROSS-REFERENCE TO RELATED APPLICATION(S)

This application is based upon and claims the benefit of priority from Japanese Patent Application No. 2020-160230, filed Sep. 24, 2020, the entire contents of which are incorporated herein by reference.

FIELD

Embodiments described herein relate generally to a semiconductor module.

BACKGROUND

In a power semiconductor module of the related art, a semiconductor device is mounted, via a solder, on a ceramic board with, for example, copper foils attached onto front and rear surfaces. The power semiconductor module is capable of dissipating heat from the ceramic board. Releasing more heat emitted from the semiconductor device improves reliability of the power semiconductor module.

DETAILED DESCRIPTION

Figure 1:
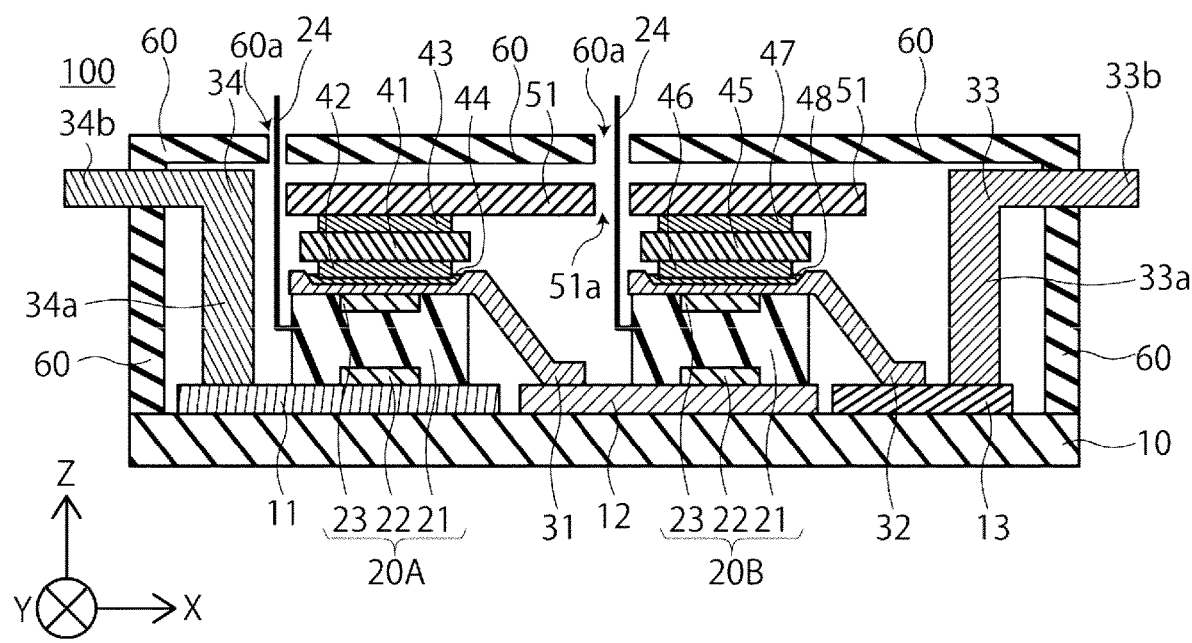
FIG. 1 is a cross-sectional view of a semiconductor module according to a first embodiment.

At least one embodiment provides a semiconductor module with high reliability.

In general, according to at least one embodiment, a semiconductor module includes: a board; a semiconductor device disposed on the board, a first surface of the semiconductor device closer to the board being connected to the board; an interconnection layer to which a second surface of the semiconductor device opposite to the first surface is connected, and which has a recess portion on an opposite surface to a surface closer to the semiconductor device; a first metal film disposed in the recess portion of the interconnection layer via a bonding film, and that is electrically connected to the interconnection layer; an insulating layer disposed on the first metal film; and a heat transfer plate disposed on the insulating layer.

At least one embodiment of the present disclosure will be described hereinafter with reference to the drawings. It is noted that a scale size, a horizontal and vertical dimensional ratio, and the like are changed and exaggerated from actual ones in the drawings attached to the present specification for the sake of convenience of diagrammatic representation and ease of understanding.

Embodiments will be described hereinafter with reference to the drawings. It is noted that identical or similar parts are denoted by identical or similar reference signs.

In the present specification, identical or similar members are denoted by identical reference signs and repetitive description thereof is often omitted.

In the present specification, an upward direction of the drawings and a downward direction thereof are expressed as "upper/upward" and "lower/downward," respectively to indicate a positional relationship among components and the like. In the present specification, concepts of "upper/upward" and "lower/downward" are not always terms indicating a relationship with a direction of gravity.

Furthermore, it is assumed that terms such as "parallel," "orthogonal," and "identical" specifying shape and geometrical conditions and degrees thereof, values of a length and an angle, and the like used in the present specification are interpreted while including ranges to such a degree that similar functions can be expected, without being bound by strict meanings.

First Embodiment

Figure 2:
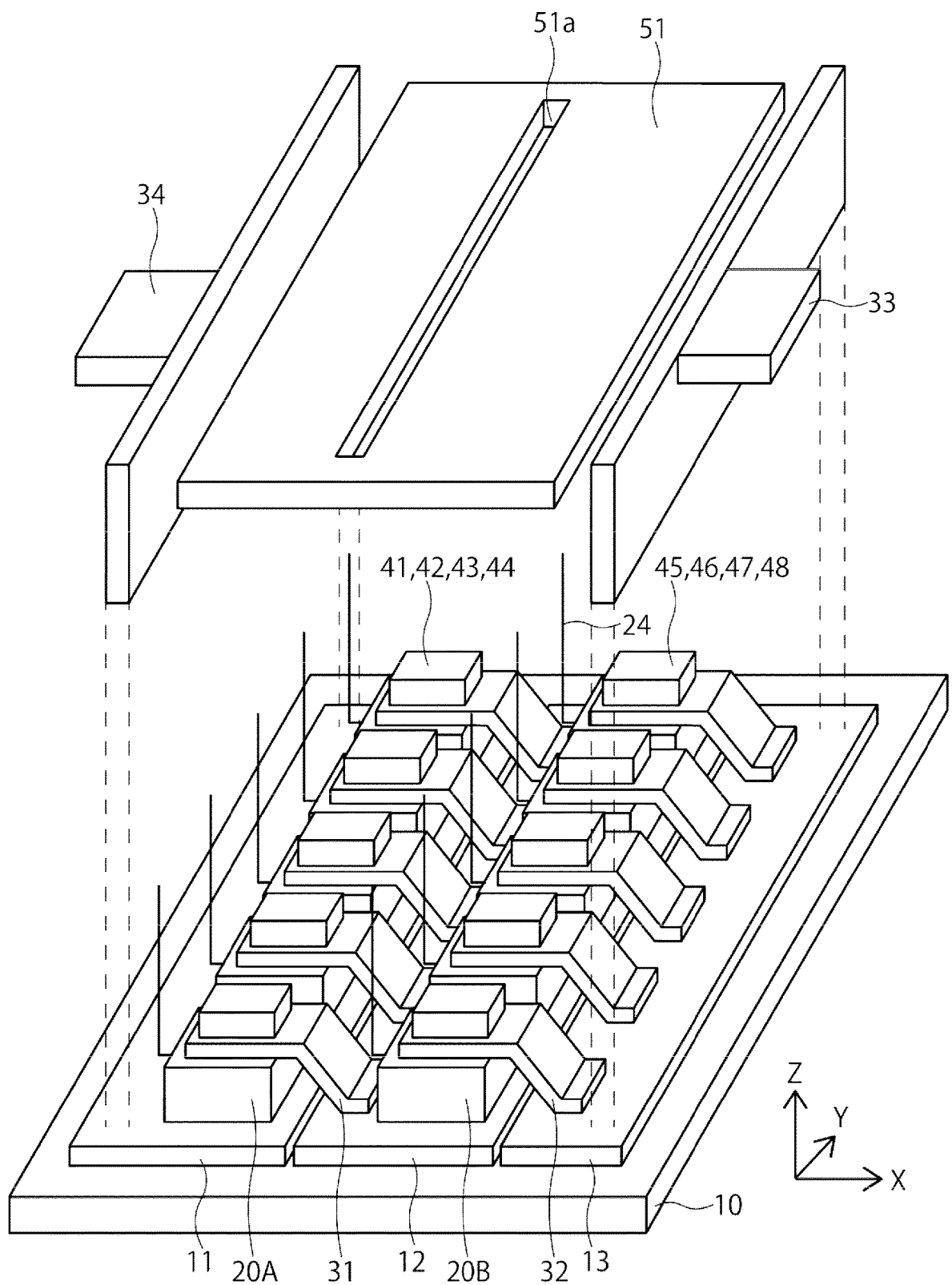
FIG. 2 is a development perspective view of the semiconductor module according to the first embodiment.

A first embodiment relates to a semiconductor module. In addition, the first embodiment relates to a semiconductor device. More specifically, the present first embodiment relates to a power semiconductor module. FIG. 1 shows a cross-section of a semiconductor module 100 according to the first embodiment. FIG. 2 shows a development perspective view of the semiconductor module 100 according to the first embodiment. FIGS. 1 and 2 represent principal parts of the semiconductor module 100. It is noted that an X direction, a Y direction, and a Z direction preferably intersect one another and are orthogonal to one another. The semiconductor module 100 may be used in a power converter such as an inverter in, for example, a wind power generation system, a photovoltaic power generation system, and a vehicle.

The semiconductor module 100 has a board 10, a first semiconductor device 20A, a second semiconductor device 20B, a first interconnection layer 31, a second interconnection layer 32, a first interconnection 33, insulating layers 41 and 45, first metal films 42 and 46, second metal films 43 and 47, bonding films 44 and 48, a heat transfer plate 51, and an external cladding 60. The first semiconductor device 20A and the second semiconductor device 20B are disposed within a case configured with the board 10 and the external cladding 60.

The board 10 may be an insulating substrate. Conductive films 11, 12, and 13 are provided on a front surface of the board 10. Preferably, types of the board 10 may include a ceramic layer or/and an insulating heat conducting resin layer. The insulating heat-conducting resin layer preferably contains a filler. The filler is one or more kinds selected from a group including, for example, boron nitride, alumina, aluminum nitride, silicon nitride, and silicon carbide. The board 10 is a member that dissipates heat emitted from the first semiconductor device 20A and the second semiconductor device 20B to the outside, and preferably exhibits a high heat-conducting property. The board 10 preferably has a heat-conducting property equal to or higher than 3 W/mK. A dielectric voltage of the board 10 is preferably equal to or higher than 17 kV/mm. The first semiconductor device 20A and the second semiconductor device 20B are provided on the conductive films 11 and 12 on the board 10.

The conductive films 11, 12, and 13 are conductive layers containing Cu and Al. The conductive films 11, 12, and 13 also extend in the Y direction. The conductive films 11, 12, and 13 are apart from one another on the board 10. The first semiconductor device 20A and a second interconnection 34 are provided on the conductive film 11 and electrically connected. The second semiconductor device 20B and the first interconnection layer 31 are provided on the conductive film 12 and electrically connected. The second interconnection layer 32 and the first interconnection 33 are provided on the conductive film 13 and electrically connected. To connect the members, it is preferable to bond the members using a solder or a conductive paste. A bonding member for use in a bonding portion where the conductive film 11 is bonded to the first semiconductor device 20A or the like is not shown.

The semiconductor module 100 has semiconductor devices. In FIG. 1, the first semiconductor device 20A is located to the left in the semiconductor module 100 and the second semiconductor device 20B is located to the right in the semiconductor module 100. The first semiconductor device 20A and the second semiconductor device 20B are adjacent to each other. The semiconductor devices are mounted in the X and Y directions, and one semiconductor module contains, for example, ten or more semiconductor devices. The first semiconductor device 20A and the second semiconductor device 20B are each an insulated gate bipolar transistor (IGBT) or MOSFET. Preferably, the first semiconductor device 20A and the second semiconductor device 20B have the same semiconductor element.

The semiconductor element of the first semiconductor device 20A according to the first embodiment is encapsulated with an encapsulation resin 21. A surface of the first semiconductor device 20A facing the board 10 is a first surface. An opposite surface of the first semiconductor device 20A to the first surface is a second surface. The first surface of the first semiconductor device 20A is opposed to the board 10. The first surface of the first semiconductor device 20A is connected to the conductive film 11. The first semiconductor device 20A has a first electrode 22 and a second electrode 23. The first electrode 22 is provided on the first surface of the first semiconductor device 20A, and the first electrode 22 is electrically connected to the conductive film 11. The conductive film 11 is also electrically connected to the second interconnection 34. The second surface of the first semiconductor device 20A is connected to the first interconnection layer 31. The second electrode 23 is provided on the second surface of the first semiconductor device 20A, and the second electrode 23 is electrically connected to the first interconnection layer 31. The first electrode 22 of the first semiconductor device 20A is, for example, an emitter electrode (source electrode), and the second electrode 23 is, for example, a collector electrode (drain electrode), and vice versa. A third electrode 24 for control extends from the first semiconductor device 20A. The third electrode 24 is, for example, a gate electrode.

The semiconductor element of the second semiconductor device 20B according to the first embodiment is encapsulated with the encapsulation resin 21. A surface of the second semiconductor device 20B facing the board 10 is a first surface. An opposite surface of the second semiconductor device 20B to the first surface is a second surface. The first surface of the second semiconductor device 20B is opposed to the board 10. The first surface of the second semiconductor device 20B is connected to the conductive film 12. The second semiconductor device 20B has the first electrode 22 and the second electrode 23. The first electrode 22 is provided on the first surface of the second semiconductor device 20B, and the first electrode 22 is electrically connected to the conductive film 12. The second surface of the second semiconductor device 20B is connected to the second interconnection layer 32. The second electrode 23 is provided on the second surface of the second semiconductor device 20B, and the second electrode 23 is electrically connected to the second interconnection layer 32. The first electrode 22 of the second semiconductor device 20B is, for example, an emitter electrode (source electrode), and the second electrode 23 is, for example, a collector electrode (drain electrode), and vice versa. The third electrode 24 for control extends from the second semiconductor device 20B. The third electrode 24 is, for example, a gate electrode.

The first semiconductor device 20A and the second semiconductor device 20B are connected in series. When a plurality of first semiconductor devices 20A are provided in the Y direction as shown in FIG. 2, the first semiconductor devices 20A ranged in the Y direction are connected in parallel. When a plurality of second semiconductor devices 20B are provided in the Y direction as shown in FIG. 2, the second semiconductor devices 20B ranged in the Y direction are connected in parallel.

The second electrode 23 of the first semiconductor device 20A is electrically connected to the first electrode 22 of the second semiconductor device 20B via the first interconnection layer 31, more specifically, via the first interconnection layer 31 and the conductive film 12.

The first interconnection layer 31 is a conductive member that electrically connects the second electrode 23 of the first semiconductor device 20A to the first electrode 22 of the second semiconductor device 20B. The first interconnection layer 31 is the conductive member configured with metals mainly containing Cu and Al.

The first interconnection layer 31 extends from the second electrode 23 of the first semiconductor device 20A to the conductive film 12. The first interconnection layer 31 is linked to a side of the conductive film 12 closer to the first semiconductor device 20A. The conductive film 12 may be connected to an external terminal, which may be a collector-emitter terminal, of the semiconductor module 100. The interconnection such as the first interconnection layer 31 may be provided with legs in surface contact with the conductive film 12 in such a manner as to face the conductive film 12, and may be ultrasonically bonded with the conductive film 12. Ultrasonic bonding makes it possible to more firmly bond the interconnection to a counterpart member than solder bonding. Preferably, the ultrasonic bonding is similarly adopted to bond the second interconnection layer 32 or the like with the other member.

A structure in which the first metal film 42, the insulating layer 41, and the second metal film 43 are stacked is connected to a recess portion of the first interconnection layer 31 via the bonding film 44. Preferably, the structure in which the first metal film 42, the insulating layer 41, and the second metal film 43 are stacked is located just on the first semiconductor device 20A.

The first interconnection layer 31 has the recess portion on a surface opposite to a surface closer to the first semiconductor device 20A. The surface of the first interconnection layer 31 facing the first semiconductor device 20A is preferably a flat surface (at an arithmetic mean roughness equal to or smaller than 0.01 mm). A bonding portion where the structure in which the first metal film 42, the insulating layer 41, and the second metal film 43 are stacked is bonded with the first interconnection layer 31 may contain many different kinds of materials. That is, materials different in coefficient of thermal expansion are gathered in the bonding portion, and the bonding portion is a principal heat transfer path in the semiconductor module 100, so that the bonding portion is a region liable to a higher thermal stress. With the higher thermal stress, the bonding film 44 is easier to peel off. When the bonding film 44 is peeled off, the heat is difficult to dissipate from the first semiconductor device 20A, possibly causing a failure in the semiconductor module 100.

To mitigate the thermal stress on the bonding film 44, therefore, the recess portion is provided on the surface opposite to the surface closer to the first semiconductor device 20A without being provided on the surface closer to the first semiconductor device 20A of the wiring layer 31. Rigidity of a part where the recess portion is disposed falls, so that it is possible to mitigate concentration of the thermal stress on the bonding film 44. If the recess portion is provided on the surface of the first interconnection layer 31 closer to the first semiconductor device 20A, then the first interconnection layer 31 is prone to warpage, and a stress accompanying the warpage is applied to the bonding film 44, and the stress causes peel-off or the like.

Furthermore, an area of the structure in which the first metal film 42, the insulating layer 41, and the second metal film 43 are stacked is smaller than an area of the first interconnection layer 31 under a space constraint within the semiconductor module 100. The area can be reduced by providing the recess portion in which at least part of the first metal film 42 in the structure in which the first metal film 42, the insulating layer 41, and the second metal film 43 are stacked is buried.

A thickness of the first interconnection layer 31 is designed in response to a current capacity as appropriate and is typically equal to or greater than 0.3 mm and equal to or smaller than 2 mm. The thickness of a part of the first interconnection layer 31 where the recess portion is not provided is preferably uniform. When the part of the first interconnection layer 31 where the recess portion is provided is thin, an electrical resistance increases in the thin part. However, a current can bypass the bonding film 44 and the first metal film 42; thus, providing the recess portion has a less influence on an electrical conducting property. Nevertheless, when the part of the first interconnection layer 31 where the recess portion is provided is excessively thin, then a mechanical strength falls and the recess portion is more difficult to work. In consideration of the rigidity and the mechanical strength, if it is assumed that a thickness of the recess portion of the first interconnection layer 31 is d1 and the thickness of the part of the first interconnection layer 31 where the recess portion is not provided is d2, it is preferable that d1/d2 is equal to or higher than 0.5 and equal to or lower than 0.9.

From viewpoints of making up for an influence of an increase in the electrical resistance of the recess portion by bypass of the current, it is preferable that a thickness of the first metal film 42 is not excessively small. It is not preferable that if the first metal film 42 is unnecessarily thick since a package of the semiconductor module 100 is made thick. Therefore, if it is assumed that the thickness of the recess portion of the first interconnection layer 31 is d1 and the thickness of the part of the first interconnection layer 31 where the recess portion is not provided is d2, it is preferable that the thickness of the first metal film 42 is equal to or greater than 0.5 times as large as (d2−d1) and equal to or smaller than 1.0 times as large as d2.

The first metal film 42 is a conductive film mainly containing Cu and Al. The first metal film 42 is electrically connected to the first interconnection layer 31 via the bonding film 44.

The insulating layer 41 is excellent in heat-conducting property. Preferably, the insulating film 41 exhibits the heat-conducting property equal to or higher than 3 W/mk. The insulating layer 41 is thermally connected to the second electrode 23 of the first semiconductor device 20A. The insulating layer 41 is disposed in the heat transfer path that propagates the heat from the first semiconductor device 20A to the heat transfer plate 51. A dielectric voltage of the insulating layer 41 is preferably equal to or higher than 17 kV/mm. Types of the insulating layer 41 preferably include a ceramic layer or/and an insulating heat conducting resin layer. To facilitate propagating the heat in the path going through the insulating layer 41, a heat conductivity [W/mK] of the insulating layer 41 is preferably higher than a heat conductivity [W/mK] of the first semiconductor device 20A.

The second metal film 43 is a conductive film mainly containing Cu and Al. The second metal film 43 is located between the insulating layer 41 and the heat transfer plate 51. The second metal film 43 is connected to the insulating layer 41 and the heat transfer plate 51. The heat propagated to the insulating layer 41 is propagated to the heat transfer plate 51 via the second metal film 43.

The bonding film 44 is a conductive member formed from a sintered solder or conductive paste. The bonding film 44 bonds the first interconnection layer 32 and the first metal film 42 together so that the first interconnection layer 31 is electrically connected to the first metal film 42. When the bonding film 44 is thin, then it is difficult to align at a time of disposing the structure in which the first metal film 42, the insulating layer 41, and the second metal film 43 are stacked in the recess portion, and a bonding failure tends to occur. When the bonding film 44 is excessively thick, the solder or the conductive paste overflows from the recess portion at a time of melting the solder or applying the conductive paste, possibly causing a short-circuit. It is, therefore, preferable that a thickness (maximum thickness) of the bonding film 44 is equal to or greater than 0.2 times and equal to or smaller than 1.0 times as large as (d1−d2) that is a depth of the recess portion.

A conductive or insulating intermediate layer may be provided between the first metal film 42 and the insulating layer 41 or/and between the second metal film 43 and the insulating layer 41.

The second interconnection layer 32 is a conductive member that electrically connects the second electrode 23 of the second semiconductor device 20B to the first interconnection 33. The second interconnection layer 32 is the conductive member configured with metals mainly containing Cu and Al. The second interconnection layer 32 is connected to the first interconnection 33 via the conductive film 13.

A structure in which the first metal film 46, the insulating layer 45, and the second metal film 47 are stacked is provided between the second interconnection layer 32 and the heat transfer plate 51 by an area similar to the area of the structure in which the first metal film 42, the insulating layer 41, and the second metal film 43 are stacked and which is provided between the first interconnection layer 31 and the heat transfer plate 51. The first metal layer 46 is connected to the second interconnection layer 32 via the bonding film 48. Since the insulating layer 45, the first metal film 46, the second metal film 47, and the bonding film 48 are similar to the insulating layer 41, the first metal film 42, the second metal film 43, and the bonding film 44, description thereof is omitted.

The first interconnection 33 electrically connects the conductive film 13 to the first electrode 22 of the second semiconductor device 20B. The first interconnection 33 is a conductive member configured with metals mainly containing Cu and Al. The first interconnection 33 is electrically connected to the conductive film 13. The first interconnection 33 has a pillar portion 33a or wall portion 33a and a terminal portion 33b that serves as a first external electrode terminal exposed to outside of the semiconductor module 100. The first interconnection 33 either has the terminal portion 33b that serves as the first external electrode terminal exposed to the outside of the semiconductor module 100, or is connected to an electrode terminal (first external electrode terminal) that is not shown.

The second interconnection 34 electrically connects the conductive film 11 to the first electrode 22 of the first semiconductor device 20A. The second interconnection 34 is a conductive member configured with metals mainly containing Cu and Al. The second interconnection 34 has a pillar portion 34a or wall portion 34a and a terminal portion 34b that serves as a second external electrode terminal exposed to the outside of the semiconductor module 100. In a case of not having the terminal portion 34b, the second interconnection 34 is connected to the second external electrode terminal that is not shown.

The heat transfer plate 51 is a highly heat-conducting member connected to the second metal films 43 and 47. The heat transfer plate 51 may be either a low electrical resistance member or a high electrical resistance member. Preferably, the heat transfer plate 51 is thermally connected to one or more types selected from among a group including the first interconnection 33, the second interconnection 34, and the external cladding 60, and releases the heat from the selected one or more types to the outside of the semiconductor module 100. In this case, the heat propagated to the heat transfer plate 51 is propagated to at least one of the first interconnection 33, the second interconnection 34, and the external cladding 60, and released to the outside of the semiconductor module 100. An opening 51a through which the third electrodes 24 are passed can be disposed in the heat transfer plate 51.

The external cladding 60 preferably has an opening 60a through which the third electrode 24 of the first semiconductor device 20A and the third electrode 24 of the second semiconductor device 20B are passed. Preferably, the opening 60a of the external cladding 60 is encapsulated with, for example, an insulating resin.

A member associated with each interconnection may be configured with a material formed from a metal or metals, or may be configured with a material having an insulating and highly heat-conducting member pasted on parts other than electrically connected surfaces.

Second Embodiment

Figure 3:
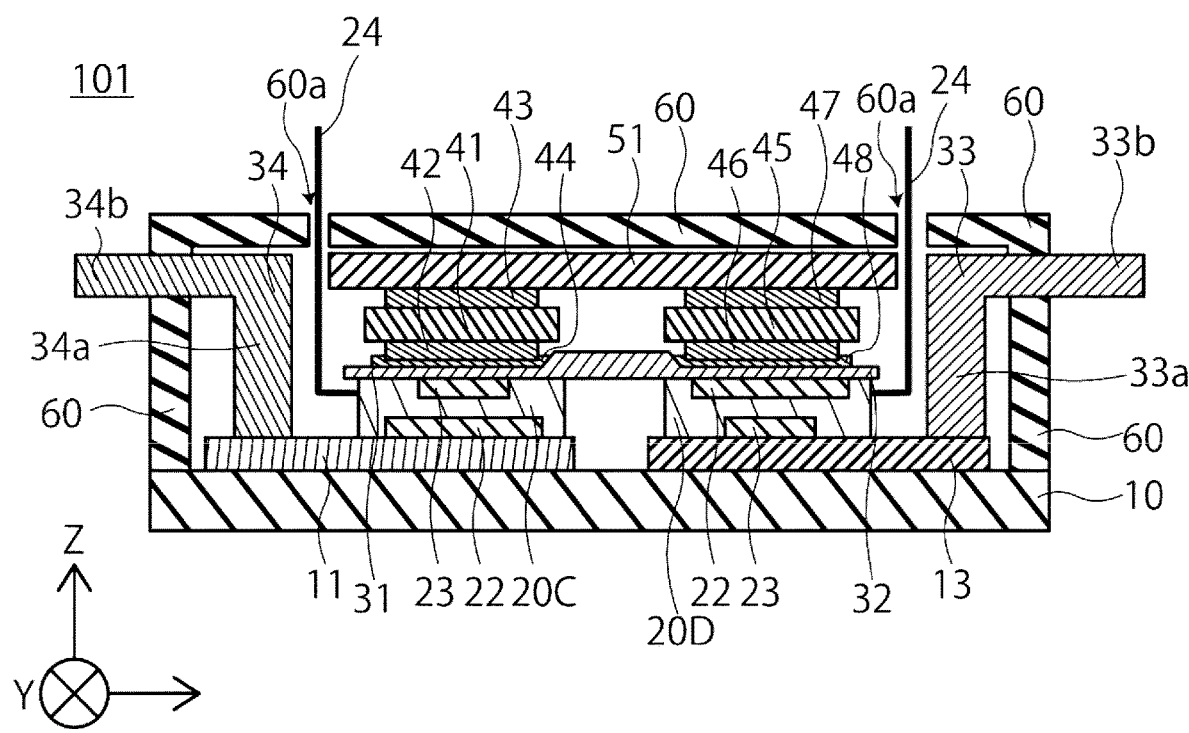
FIG. 3 is a cross-sectional view of a semiconductor module according to a second embodiment.

A second embodiment relates to a semiconductor module. FIG. 3 shows a cross-section of a semiconductor module 101 according to the second embodiment. The semiconductor module 101 according to the second embodiment differs from the semiconductor module 100 according to the first embodiment in that bare chips (semiconductor elements) 20C and 20D each of which is not encapsulated with a resin are used as the first semiconductor device 20C and the second semiconductor device 20D as an alternative to the semiconductor devices encapsulated with the resin, the second semiconductor device 20D has a reversed polarity from a polarity of the first semiconductor device 20C, the first interconnection layer 31 and the second interconnection layer 32 are coupled with each other, and recess portions are provided on two ends of the first interconnection layer 31 and the second interconnection layer 32 coupled to each other. Description of contents common to the semiconductor module 100 according to the first embodiment and the semiconductor module 101 according to the second embodiment is omitted.

Since the bare chips 20C and 20D are thinner than the semiconductor devices 20A and 20B by as much as the resin with which each of the bare chips 20C and 20D is not encapsulated, a package height of the semiconductor module 101 can be reduced. In the second embodiment, an example of providing a plate portion 34c in the second interconnection 34 to achieve a package with a higher heat dissipation property instead of reducing the package height is illustrated.

As for the first semiconductor device 20C, a surface of the semiconductor element that is the bare chip closer to the board 10 is a first surface of the first semiconductor device 20C, and an opposite surface of the semiconductor element that is the bare chip to the first surface is a second surface of the first semiconductor device 20C. The first electrode 22 is provided on the first surface of the first semiconductor device 20C, while the second electrode 23 is provided on the second surface thereof.

As for the second semiconductor device 20D, a surface of the semiconductor element that is the bare chip closer to the board 10 is a first surface of the second semiconductor device 20D, and an opposite surface of the semiconductor element that is the bare chip to the first surface is a second surface of the second semiconductor device 20D. The second semiconductor device 20D is mounted on the board 10 in such a manner as to have the reversed polarity from the polarity of the first semiconductor device 20C. The second electrode 23 is provided on the first surface of the second semiconductor device 20D, while the first electrode 22 is provided on the second surface thereof.

Coupling the first interconnection layer 31 with the second interconnection layer 32 enables electrical connection between the second electrode 23 of the first semiconductor device 20C and the first electrode 22 of the second semiconductor device 20D.

As shown in FIG. 3, the recess portions of the first interconnection layer 31 and the second interconnection layer can be provided on tip ends of the first and second interconnection layers 31 and 32, respectively.

By providing the recess portions on opposite sides of the first interconnection layer 31 and the second interconnection layer 32 coupled with each other to sides thereof closer to the semiconductor devices, the thermal stress is mitigated. Therefore, the semiconductor module 101 is configured in such a manner that the thermal stress within the semiconductor module 101 is mitigated, so that reliability of the semiconductor module 101 is enhanced.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A semiconductor module comprising:
   a board;
   a semiconductor device disposed on the board, the semiconductor device having a first surface facing the board and a second surface opposite to the first surface;
   an interconnection layer having a first interconnection layer surface facing the second surface of the semiconductor device, and a second interconnection layer surface opposite to the first interconnection layer surface, the second interconnection layer surface having a recess portion;

a first metal film disposed on the recess portion via a bonding film, the first metal film being electrically connected to the interconnection layer;

an insulating layer disposed on the first metal film; and a heat transfer plate disposed on the insulating layer.

2. The semiconductor module according to claim 1, wherein for a thickness of the recess portion of the interconnection layer being d1 and a thickness of the interconnection layer other than the recess portion being d2, d1/d2 is equal to or higher than 0.5 and equal to or lower than 0.9.

3. The semiconductor module according to claim 1, wherein the insulating layer is either a ceramic layer or an insulating heat-conducting resin layer.

4. The semiconductor module according to claim 1, comprising a second metal film between the insulating layer and the heat transfer plate.

5. The semiconductor module according to claim 1, wherein the semiconductor device includes a semiconductor element encapsulated with a resin.

6. The semiconductor module according to claim 1, wherein the semiconductor device has a semiconductor element that is a bare chip.

7. The semiconductor module according to claim 1, wherein for a thickness of the recess portion of the interconnection layer being d1 and a thickness of the interconnection layer other than the recess portion being d2, a thickness of the first metal film is equal to or greater than 0.5 times as large as (d2−d1) and equal to or smaller than 1.0 times as large as d2.

8. The semiconductor module according to claim 1, wherein the second interconnection layer surface is a flat surface.

9. The semiconductor module according to claim 1, wherein a tip end of a recess portion is located on a tip end of the interconnection layer.

10. The semiconductor module according to claim 1, wherein the board has a heat conductivity of greater than or equal to 3 W/mK.

11. The semiconductor module according to claim 1, wherein a heat conductivity of the insulating layer is greater than that of the semiconductor device.

12. The semiconductor module according to claim 1, wherein the bonding film includes at least one of sinter solder or conductive paste.

13. The semiconductor module according to claim 1, wherein the semiconductor device includes a plurality of semiconductor devices.

14. The semiconductor module according to claim 13, wherein the plurality of semiconductor devices are connected in series.

15. The semiconductor module according to claim 14, wherein each of the plurality of semiconductor devices includes a semiconductor element that is a bare chip.

16. The semiconductor module according to claim 1, wherein the first metal film contains mainly Cu and Al.

17. The semiconductor module according to claim 1, wherein the insulating layer is an insulating heat-conducting resin layer containing a filler.

18. The semiconductor module according to claim 1, wherein the semiconductor device has at least one semiconductor element including a bare chip and a chip encapsulated in resin.

* * * * *